United States Patent

[11] 3,620,733

[72] Inventors Hartmut Steppan Wiesbaden-Dotzheim; Günter Messwarb, Kelkheim; Walter Lüders, Neu-Isenburg, all of Germany
[21] Appl. No. 697,636
[22] Filed Jan. 15, 1968
[45] Patented Nov. 16, 1971
[73] Assignee Kalle Aktiengesellschaft Wiesbaden-Biebrich, Germany
[32] Priority Jan. 18, 1967
[33] Germany
[31] F 51271

[54] LIGHT-SENSITIVE REPRODUCTION LAYER AND PROCESS

34 Claims, No Drawings

[52] U.S. Cl. .......... 96/33, 96/35.1, 96/115 R
[51] Int. Cl. .......... G03c 1/68, G03c 1/70
[50] Field of Search .......... 96/115, 35.1, 33

[56] References Cited

UNITED STATES PATENTS

| | | | |
|---|---|---|---|
| 2,831,768 | 4/1958 | Merrill et al. | 96/115 |
| 3,120,564 | 2/1964 | Milionis et al. | 252/300 X |
| 3,183,219 | 5/1965 | Schuler | 96/84 X |
| 3,214,492 | 10/1965 | Tocker | 260/878 |
| 3,330,656 | 7/1967 | Schuler | 96/84 |
| 3,341,493 | 9/1967 | Goldberg et al. | 260/78.5 X |

*Primary Examiner*—Ronald H. Smith
*Attorney*—James E. Bryan

ABSTRACT: The present invention relates to a light-sensitive reproduction layer and a process for utilizing the layer, the layer comprising or consisting of a light-sensitive copolymer of at least one vinyl monomer, which by itself yields water-soluble polymers, with at least one light-sensitive monomer containing a ketone group.

LIGHT-SENSITIVE REPRODUCTION LAYER AND PROCESS

The present invention relates to reproduction layers consisting of or containing, as the light-sensitive component, water-soluble polymers with uninterrupted principal C–C chains which are by themselves light-sensitive, the differentiation in the water-solubility of the exposed and unexposed areas caused by image-wise exposure to light of such reproduction layers being utilized for their application.

The light-sensitive polymers used in the reproduction layer according to the invention are copolymers of monomers which form water-soluble polymers with monomers containing ketone groups.

The preparation of light-sensitive vinyl polymers of the ketone-type and their use in reproduction layers, utilizing the differentiation in the solubility characteristics of the exposed and nonexposed areas of the layer after imagewise exposure, are already known. Thus, it has been suggested, e.g., in British Pat. Specification No. 893,616 to use, as the light-sensitive component of reproduction layers, acetals of polyvinyl alcohols and aldehydes corresponding to the following general formula:

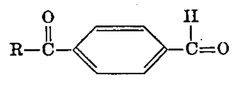

wherein

R is $CH_3$ aralkyl or aryl.

These acetals are prepared by a (normally heterogeneous) reaction of polyvinyl alcohol with the respective aldehydes or of the acetals prepared in this manner with lower alcohols.

Further, polyketones, e.g., polyvinyl benzophenone, are known from U.S. Pat. Specification No. 2,831,768 as components of light-sensitive reproduction layers. However, the polymeric compounds mentioned in this patent specification are obtained, e.g., under the conditions of a Friedel-Crafts synthesis, by the reaction of already prepared polymeric chains, which is also a rather cumbersome procedure.

The reproduction layers consisting of these known polymeric compounds have only limited solubility or are even insoluble in water, so that the layers must be decoated (developed) in most cases with organic solvents, while aqueous organic solvents are suitable in a few cases only, and hot water is very rarely sufficient to differentiate them into exposed and nonexposed areas. The polymers used in the reproduction layer of the invention are very easily prepared and the unexposed areas of the layer may be dissolved away by a treatment with cold water.

The present invention is concerned with a reproduction layer which contains, consists of, water-soluble polymers which by themselves are light-sensitive. These inherently light-sensitive polymers are copolymers, on the one hand, of vinyl monomers which yield water-soluble polymers, e.g., copolymers containing at least one of the following monomeric compounds:

acrylamide
methacrylamide
monomethyl acrylamide
dimethyl acrylamide
monomethyl methacrylamide
dimethyl methacrylamide
N-methyl-N-vinyl formamide
N-methyl-N-vinyl acetamide
N-vinyl pyrrolidone
N-ethyl-N-vinyl acetamide
N-methyl-N-vinyl carbamic acid ethyl ester
N-vinyl oxazolidinone
N-vinyl caprolactam
4-methyl-N-vinyl acetidinone
4,4-dimethyl-N-vinyl acetidinone
3,4-dimethyl-N-vinyl acetidinone
N-vinyl imidazole, and, on the other hand, of photoactive monomeric ketone compounds corresponding to one or more of the following general formulas I, II and III:

I.
II.
III.

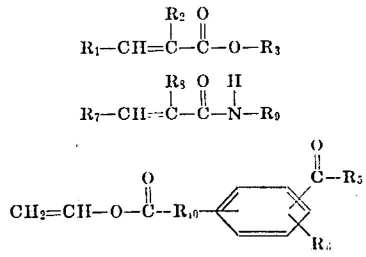

in which $R_1$ is H, $-COOR_3$ or –COO–alkyl;

$R_2$ is H, alkyl, $-CH_2COO$–alkyl or $-CH_2COOR_3$ (only one of the substituents $R_1$ and $R_2$ containing, however, the carbonyl group CO);

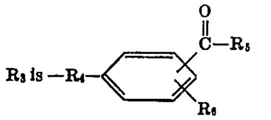

with $R_4$ being a single bond or $-CH_2$or $-CH_2-CH_2-O$;

$R_5$ is alkyl phenyl, alkaryl, alkoxyaryl or halogen aryl;

$R_6$ is H, alkyl, alkoxy or halogen;

$R_7$ is H, $-CON(H)-R_9$, –COO-alkyl, $-COOR_3$ or –COOH;

$R_8$ is H, alkyl, $-CH_2$CONH–alkyl, $-CH_2-CONH-R_9$, $-CH_2-COO$ –alkyl, $-CH_2-COOR_3$, or $-CH_2-COOH$ (wherein only one of the substituents $R_7$ and $R_8$ contains the carbonyl group CO, and

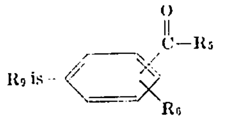

and wherein, in the case of the ketone monomers corresponding to Formula II which are itaconic acid derivatives, the carboxylic acid functions NH-alkyl, -O-alkyl, $OR_3$ and OH described for the substituent $R_8$ may replace the substituent, $-NH-R_9$ and vice versa, and $R_{10}$ is a single bond or $-CH_2O$.

In addition to the water-soluble vinyl monomers and the photoactive ketone monomers, there also may be included, in the copolymers, nonphotoactive monomers which by themselves yield water-insoluble polymers, e.g., vinyl acetate styrene, acrylonitrile, acrylic esters an acrylamides having fairly long alkyl radicals at the nitrogen atom, e.g., diacetone acrylamide and the like. Normally, the proportion of these monomers should not exceed 80 per cent by weight. However, all that must be considered when deciding on the permissible quantity of these monomers in the copolymers is that such additions must not interfere with the developability of the reproduction layer, prepared with these copolymers, with water or with aqueous solutions which contain no organic solvents but may contain hydrophilizing agents for the supporting material, e.g., phosphoric acid, silicates, inorganic fluorides, or gum arabic. As long as the layers can be developed with water or with aqueous solutions, they are within the scope of the present invention.

In some cases, the addition of a third monomeric compound during the preparation of the copolymer may facilitate the formation of genuine copolymers.

The quantity of photoactive monomer to be included in the copolymer is limited by requirement that the polymer formed must yield a water-developable layer. Generally, not more than 40 per cent by weight of such monomeric compound is included in the polymer. Preferably, the quantity ranges from 1 to 20 percent by weight.

Copolymers which contain photoactive monomers of the benzophenone type are preferable to those containing monomers of the acetophenone type, because they possess a greater light-sensitivity. Particularly advantageous reproduction layers of the invention for development with water or with aqueous solutions are those which contain copolymers into which photoactive monomers of the above-described Formula II are incorporated, because such copolymers are distinguished by a greater light-sensitivity from comonomers containing photoactive monomers of formulas I or II as units.

The preparation of the light-sensitive polymers may be effected under any conditions under which the monomers in question react to form copolymers.

The water-soluble reproduction layer according to the invention may be used for production of copies of various kinds, e.g., for the production of single copies from a transparent negative master. For the preparation of such single copies the following procedure maybe employed: Suitable supports such as paper, plastic film or metal foil (preferably superficially roughened) are coated with the reproduction layer and then image-wise exposed. In order to develop the copy produced (i.e., render it visible, one of the following procedures may be used:

a. The entire layer surface is wiped over with a very finely pulverized pigment which is accepted by the entire surface. When the material is the rinsed with water, the pigment is quickly removed from the unexposed areas of the layer, whereas it adheres to those areas of the layer which had been struck by light.
b. After image-wise exposure, the unexposed parts of the layer are washed away with water. The cross-linked areas of the layer are then inked up with a dye-stuff solution. It is required for this procedure, that the dyestuff solution is not accepted by the supporting material.

Further, a reproduction material carrying the reproduction layer of the invention may be used for the preparation of printing plates, e.g., relief printing plates, but in particular of printing forms for planographic and offset printing. Preferably, the reproduction layer of the invention is applied to single-metal plates of aluminum or zinc, advantageously such as are pretreated to improve adhesion, and the printing forms are prepared in accordance with the so-called positive process In this process, the reproduction layer is exposed under a transparent positive master, which causes the layer under the transparent areas of the master to become cross-linked and insoluble. Then the layer is removed from the noncross-linked areas by a developing process, the metal in the bared areas is activated, i.e., made lacquer-receptive, by deep-etching, and the activated metal areas are finally covered with an thin layer of a lacquer. In the normal performance of this process, the lacquer layer is then dried and inked up with greasy ink.

Whereas the lacquer layer adheres well to the activated metal surface, it is removed from the areas covered by the cross-linked reproduction layer, together with this layer, by means of suitable solutions during the following decoating step. Thus, a positive printing form results from a positive master. The nonimage areas consist of the hydrophilic metal bared during the decoating process.

Combinations of water-soluble, but not naturally light-sensitive colloids with chromates, bichromates, or azido compounds, which undergo a reduction of their solubility or become insoluble under the influence of light, have in particular been proposed hitherto as reproduction layers for performing the positive process just described. However, these system have some pronounced disadvantages. For instance, copying layers containing chromates or bichromates in combination with water-soluble colloids do not harden under light-influence only, but become completely hardened within a few hours even in the absence of light. Therefore, such reproduction layers cannot be stored, and it is necessary to prepare them only a short time before preparing the copy. Further, these layers have the drawback that some persons are sensitive to chromates and develop eczemas upon contact with these substances.

A further drawback of the colloid layers sensitized by means of chromates, as of those sensitized with azido compounds, is the fact that strongly absorbing dyestuffs are formed under the influence of light (actinic radiation) which impedes a penetration of this radiation into the deeper parts of the layer.

The reproduction layer according to the invention avoids these drawbacks of the known reproduction layers. A further advantage of the reproduction layer according to the invention is that the layer cross-linked by light action repels greasy ink when it is wetted with water, so that a removal of the cross-linked reproduction layer from the nonimage areas, i.e., a decoating, can be dispensed with when the positive process is performed, thus preventing the lacquer image from being attacked by the frequently corrosive chemicals used for decoating and, in addition, simplifying the processing procedure. After the lacquer film has dried, all that is necessary is to remove the lacquer film deposited on the nonimage areas by a gentle wiping with water or with highly diluted phosphoric acid.

The process of the invention is particularly advantageous when, for the preparation of the copolymer, those monomers are exclusively or preponderantly used as nonphotoactive monomers which by themselves form water-soluble polymers. Therefore, addition of monomer which by themselves do not form water-soluble polymers is normally limited, for the present purpose, to quantities up to 30–40 percent, preferably up to 20 percent by weight.

An increase of the proportion of the latter monomers in the polymers causes the ink-repellent characteristics of the layer, cross-linked by light action, to become progressively weaker, which means that the layer becomes increasingly oleophilic, while the water developability of thin reproduction layers, i.e., layers of up to about 30$\mu$ is maintained.

This range of composition of the copolymer, in which the cross-linking products of the polymers formed by light action accept greasy ink, while the nonexposed areas of the layer still can be removed with water or with aqueous solutions, results in another preferred application of the present reproduction layer for the preparation of planographic printing plates. It permits the preparation of positive printing forms from negative transparent masters, the printing forms being later reinforced by means of suitable lacquer solutions to improve their printing performance, if desired. The copolymer composition range in which a negative copy can be produced with particular advantage, while the water developability of thin layers is still maintained, depends on the combination of monomers used.

Generally, water-developable layers suitable for the preparation of negative copies can be obtained when the proportion of monomers yielding water-insoluble polymers is from 30 to 80 percent of the entire quantity of monomers The borderline between water developable and no longer water developable and ink-repellent and ink-receptive layers has to be determined separately for each combination of monomers by experimentation. Reproduction layers of the latter kind are described in detail in examples 10 and 11 herein.

For the preparation of the reproduction material, the reproduction layers of the invention are applied to the desired support in known manner, e.g., by coating, whirl-coating swabbing, immersion, roller-application, lamination of a film and the like, and then are dried in a current of warm air. Particularly when thicker layers are to be applied, it may be advisable to provide the support with an antihalation layer before coating it. Dyestuffs, sensitizers, nongaseous polymerizable monomers having at leas tone terminal ethylenically-unsaturated group, such as mono or polyfunctional acrylic acid or methacrylic acid esters and amides, pigments, wetting agents, antioxidants, stabilizers against thermal decomposition, and organic or inorganic fillers may be incorporated in the reproduction layer. Nonphotoactive, preferably water-soluble polyethers or vinyl polymers may be used, e.g., as organic fillers.

Glass powder, very finely divided silica, clay, and the like may be added as inorganic fillers. However, these additives must be selected so that the optical transparency of the reproduction layer within the primary absorption range of the light-sensitive copolymers is impeded as little as possible.

The quantity of dyestuffs and inorganic fillers added advantageously should be below 30 per cent by weight of nonphotoactive polymers preferably below 50 percent.

Further the quantity and type of additives must be selected so that the water-developability is maintained.

The reproduction layer according to the present invention will be further illustrated in detail by the following examples.

The copolymers may be prepared in accordance with the following general procedure.

In a reaction vessel 80 parts by weight of peroxide-free dioxane are heated to 90° C. in a nitrogen atmosphere. A solution of the monomers (20 parts by weight) in each other or with the addition of a small quantity of dioxane is prepared 1 per cent by weight of a catalyst, e.g., azoisobutyric acid nitrile, is added, and polymerization is initiated by drop-wise introducing one-third of the mixture, during a relatively short time, into the reaction vessel. The remainder of the monomer is added in small quantities over a period of 30 to 60 minutes. After 4 hours, an additional 0.25 per cent by weight of the catalyst is added and polymerization is continued for another 4 hours under the same cnditions.

After the solids content has been determined, the polymer solution thus produced may be directly used for the preparation of the reproduction layers. Alternatively, the polymers may be precipitated and used, e.g., in solution in a different solvent for coating. This procedure is in any case advisable when copolymers are prepared which are difficulty soluble in dioxane, e.g., those which contain acrylamide units.

EXAMPLE 1

An electrolytically roughened aluminum foil is whirl-coated with an 11.4 percent by weight solution in dioxane of a copolymer prepared from 90 parts by weight of N,N-dimethyl acrylamide and 10 parts by weight of 4-acryl amido benzophenone. The coating is then dried for 2 minutes at 100° C. Image-wise exposure is effected under a transparent positive master with writing thereon, using an exposure device containing 13 fluorescent tubes fluorescent tubes of the type "Philips TL-AK 40 W/05" mounted on a 60×60 cm. surface. The distance from the lamp is 7 to 8 cm., the cover plate consists of a polyvinyl chloride film, and the exposure time is 3 minutes.

The plate is then developed by means of a water spray and carefully dried. Then it is treated for a short time with a so-called deep etching solution, e.g., solution of the following composition:

41.3 parts by weight of $CaCl_2 \cdot 2H_2O$
44.0 parts by weight of $H_2O$
5.6 parts by weight of $ZnCl_2$ (desiccated)
2.83 parts by weight of $FeCl_3 \cdot 6H_2O$
0.5 parts by weight of HCl (concentrated)
6.0 parts by weight of $C_2H_5OH$ used After lacquer Removal
hardened is not does and thoroughly rinsed with water. After carefully drying, the plate is lacquered with one of the lacquers customarily used in positive processes. The lacquer described in Belgian Pat. No. 652,098 is suitable, for example. After carefully drying, the lacquer adhering to the areas cross-linked by light influence is removed by wiping with a pad moistened with water. Removal of the hardened reproduction layer is not necessary, because it does not accept greasy ink when it is wet. A positive planographic printing plate is thus obtained which yields long printing runs.

EXAMPLE 2

An electrolytically roughened aluminum solution is whirl-coated with an 11.4 percent by weight solution of a copolymer prepared from 1 part by weight of 4-acrylamido benzophenone and 99 parts by weight of N,N-dimethyl acrylamide. The plate is exposed for 10 minutes under a negative master with writing thereon, using the light source described in example 1. It then is sprayed with water, dried, dipped into an alcoholic solution of Victoria Blue B (Color Index No. 4,045), rinsed again with water and dried. From this printing plate, copies may be prepared by the transfer process, using aqueous alcohol.

EXAMPLE 3

As described in example 1, an electrolytically roughened aluminum foil is coated with a 3.3 percent by weight solution in dioxane of a copolymer prepared from 100 parts by weight of N,N-dimethyl acrylamide and 6 parts by weight of 4-acryloxybenzophenone and then dried. The plate is exposed for 10 minutes under a positive screen master, using the light-source described in example 1. Further processing is as in example 1. After being carefully dried, the lacquer layer is removed from the cross-linked reproduction layer by wiping over with a 1.5 percent by weight aqueous solution of phosphoric acid. Removal of the cross-linked reproduction layer can be dispensed with, because it does not accept greasy printing ink in the wet state. A positive offset printing plate is thus obtained from which long runs can be printed.

Instead of the copolymer described above, it also is possible to use a copolymer prepared from 100 parts by weight of N,N-dimethyl acrylamide and 2 parts by weight of 4-acryloxybenzophenone for coating. An efficient printing form is likewise obtained by the same process. However, this reproduction layer is somewhat less light-sensitive than the one described above.

EXAMPLE 4

The process described in example 1 is repeated, using for coating, however, a 3.5 percent by weight solution in dioxane of a copolymer prepared from 80 parts by weight of dimethyl acrylamide and 20 parts by weight of 4-acrylamido acetophenone. After image-wise exposure (exposure time: 10 to 15 minutes) under the light source described in example, 1, the plate is processed into a printing form as described in example 1.

EXAMPLE 5

The process described in example 1 is repeated, using for coating, however, a 6.7 percent by weight solution in dioxane of a copolymer prepared from 70 parts by weight of N-vinyl-N-methyl-acetamide, 25 parts by weight of vinyl acetate and 5 parts by weight of 4-acrylamido benzophenone. Exposure time under the light source described in example 1 is about b 5 to 10 minutes. The plate is also processed according to the positive process.

EXAMPLE 6

The process described in example 1 is repeated, using for coating, however, a 5 percent solution in dioxane of a copolymer prepared from 95 parts by weight of N-vinyl pyrrolidone and 5 parts by weigh of a monomer of the following formula:

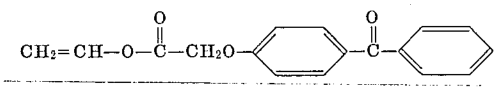

Image-wise exposure is effected by means of a light source as described in example 1. Exposure time: 10 minutes. Processing into a printing form is by the positive process.

EXAMPLE 7

The process described in example 1 is repeated, using for coating, however, an aqueous solution of a copolymer prepared from 70 parts by weights of dimethyl acrylamide, 25 parts by weight of acrylamide, and 5 parts of weight of an unsaturated monomer corresponding to the following formula

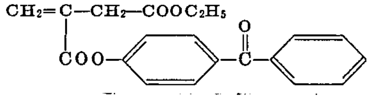

Processing is by the positive process. The duration of the image-wise exposure, under the conditions described in example 1, is 5 to 10 minutes.

EXAMPLE 8

The process described in example 1 is repeated, using for recoating, however, a 5 percent solution in dioxane of a copolymer prepared from 85 parts by weight of dimethyl acrylamide, 10 parts by weight of vinyl acetate, and 5 parts by weight of a photoactive monomer corresponding to the formula

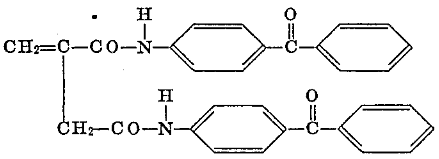

The material is image-wise exposed for 2 minutes under the lamp described in example 1 and further processed by the positive process. Alternatively it is possible to produce tanning or pigment copies from this reproduction material by image-wise exposing for 30 to 40 seconds under the same condition, rubbing with a pigment, and rinsing with water, or by rinsing with water after exposure, drying, and inking with a dyestuff solution. In these cases, positive copies are produced from negative masters.

EXAMPLE 9

The process described in example 8 is repeated; using for coating, however a 5 percent solution in dioxane of a copolymer prepared from 85 parts by weight of dimethyl acrylamide, 10 parts by weights of vinyl acetate, and 5 parts by weight of a photoactive monomer of the formula

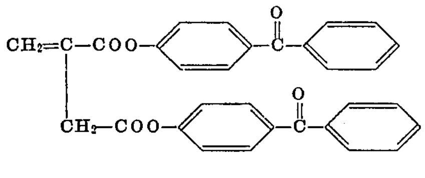

The exposure time for the positive process was 10 minutes, for the preparation of pigment images 2 minutes, and for the preparation of tanned images 5 minutes.

EXAMPLE 10

For the preparation of a negative-working reproduction material from which planographic printing plates can be produced, an electrolytically roughened aluminum foil is coated on a plate whirler with a solution of a copolymer prepared from vinyl acetate, N,N-dimethyl acrylamide, and 4-acrylamido benzophenone, the solution being prepared by diluting the copolymer solution made as described below with dioxane in a proportion of 1:3 by weight. The foil is dried for 2 minutes at 100° C. and then exposed for 4 to 5 minutes under a negative screen master, using the exposure device described in example 1.

Development is effected by wiping the foil briefly with a 0.2 percent aqueous solution of sodium metasilicate and rinsing with water. The plate, which still carries a thin moisture film is then reinforced by means of the lacquer described in example 1 of Belgian Pat. No. 625,787. A deep-blue, positive lacquer image is thus obtained from which long runs can be printed.

The photoactive polymer was prepared as described above at the beginning of the examples. A mixture of the following monomers was used: 17 parts by weight of vinyl acetate, 2 parts by weight of dimethyl acrylamide, and 1 part by weight of the compound of the formula

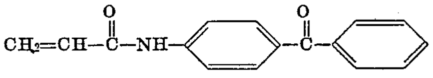

The solids content of the solution obtained by the copolymerization process was 13.1 percent weight. This solution was further diluted with dioxane for coating.

EXAMPLE 11

The process described in example 10 is repeated, using for coatings however, a coating solution containing 3.6 percent by weight of a copolymer prepared from 10 11by weight of N-tert.-butylacylamide, 9 parts by weight of N,N-dimethyl acrylamide, and 1 part by weight of 4-acrylamido benzophenone.

Exposure and development are performed as described in example 10. In this case, too, from a negative master a positive printing plate is obtained which can be reinforced with a lacquer in the same manner.

EXAMPLE 12

The coating solution used in example 8 is whirl-coated onto a polyethylene terephthalate film roughened by sandblasting. After image-wise exposure (2 to 3 minutes) under a line negative, the film is sprayed with water, wetted with an about 1 percent by weight aqueous solution of Crystal Violet (Color Index No. 42,555), briefly rinsed with water, and dried. A deep-violet positive image results.

EXAMPLE 13

The process described in example 8 is repeated, using for coating, however a 5 percent by weight solution in dioxane of a copolymer prepared from 95 parts by weight of N,N-dimethylacrylamide and 5 parts by weight of a photoactive monomer of the formula

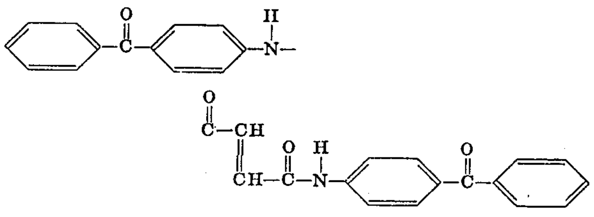

After image-wise exposure (5 minutes under the light source used in example 1behind a line negative, the film is developed by spraying with water and dyed by means of an aqueous solution of Methylene Blue BB (Color Index No. 52,15) similarly to the procedure described in example 12. A positive copy results.

EXAMPLE 14

The process described in example 8 is repeated, using, however, coating solutions to which, respectively, 5 and 20 percent, calculated on the 5 percent by weight of photoactive copolymer (solids), of methylene bis-acrylamide are added. When they are image-wise exposed (5 min.) under a positive master similarly example 8 and processed by the positive process, these reproduction layers also yield positive planographic printing forms, no decoating being necessary.

EXAMPLE 15

The process described in example 1 is repeated, using for coating, however 5 percent solutions in dioxane of the following copolymers:

a. A copolymer prepared from 95 parts by weight of N,N-dimethyl-acrylamide and 5 parts by weight of a monomer of the formula

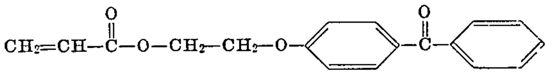

b. A copolymer prepared from 95 parts by weight of N,N-dimethyl-acrylamide and 5 parts by weight of a monomer of the formula

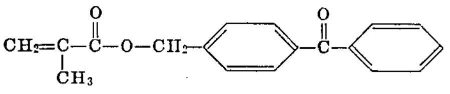

In the case of the copolymer described sub a), the foil is image-wise exposed for 5 minutes, in the case of the copolymer described sub b) for 10 minutes in the manner described in example 1, using a positive master.

Processing into printing plates is effected by the positive process.

EXAMPLE 16

Baryta paper is whirl-coated with a 5 percent solution in dioxane of a copolymer prepared from 95 parts by weight of N,N-dimethyl acrylamide and 5 parts by weight of a monomer of the formula

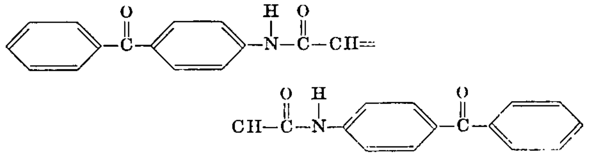

and the layer is dried for 2 minutes at 100° C.

The material is exposed for 2 to 3 minutes under a line negative, using the light source described in example 1, the entire surface is rubbed in with a finely divided pigment, e.g., with Paratoner B (Shultz' Farbstofftabellen, 7th edition, Vol. 1, 1931, No. 60), and then cautiously sprayed with water until the pigment has been removed from the unexposed areas of the layer. A positive copy is thus produced. Exposure also may be effected under a 5,000 Watt xenon impulse lamp (using a vacuum printing frame provided with a glass plate). Exposure time: 5 minutes.

EXAMPLE 17

Baryta paper is whirl-coated with a 5 percent solution in dioxane of a copolymer prepared from 95 (parts by weight of N,N-dimethyl acrylamide and 5 parts by weight of a monomer of the formula

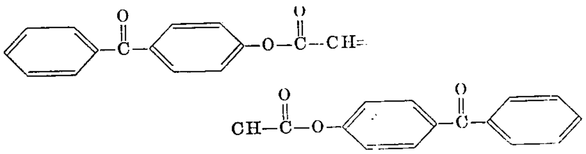

to which 20 percent by weight (based on the solids content) of powdered Heliogen Blue (Color Index No. 74,160) have been added, and dried for 2 minutes at 100° C.

The material is exposed for 4 minutes under a line negative under the conditions described in detail in example 1 and then sprayed with water. Thereby, the unexposed layer is removed together with the pigment. A blue-tanned image on a white background is thus produced.

It will be obvious to those skilled in the art that many modifications may be made within the scope of the present invention without departing from the spirit thereof, and the invention includes all such modifications.

What is claimed is:

1. A supported light-senstive reproduction layer comprising a light-sensitve copolymer of an effective amount of at least one vinyl monomer which by itself yields water-soluble polymers, with an effective amount of at least one light-sensitive monomer of the following formulas I, II, and III:

I.

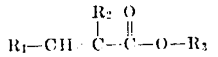

II.

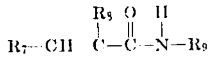

III.

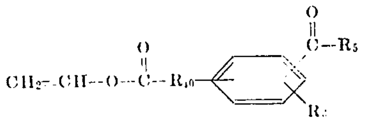

wherein $R_1$ is–$COOR_3$ or COO–alkyl;

$R_2$ is H, alkyl, –$CH_2$COO–alkyl or –$CH_2COOR_3$ (only one of the substituents $R_1$ and $R_2$ containing, however, the carbonyl group CO);

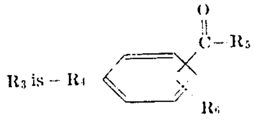

with $R_4$ being a single bond or –$CH_2$ or –$CH_2$–$CH_2$–O;

$R_5$ is alkyl, phenyl alkaryl, alkoxyaryl or halogen aryl;

$R_6$ is H, alkyl, alkoxy or halogen;

$R_7$ is H, –CON(H)–$R_9$, –COO-alkyl, –COOR$_3$ or COOH;

$R_8$ is H, alkyl, –$CH_2$COH–alkyl, –$CH_2$–CONH–$R_9$, –$CH_2$–COO–alkyl, –$CH_2$–$COOR_3$ $_3$ or –CH–COOH (wherein only one of the substituents $R_7$ and $R_8$ contains the carbonyl group CO, and

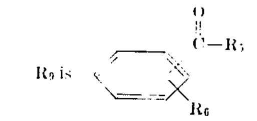

and wherein, in the 9, of the ketone monomers corresponding to Formula II which are itaconic acid derivatives, the carboxylic acid function NH–alkyl, -O-alkyl, $OR_3$ and OH described for the substituent $R_8$ may replace the substituent, -NH-R 9and vice versa, and $R_{10}$ is a single bond or $-CH_2O$.

2. A reproduction layer according to claim 1 in which the copolymer includes, by polymerization, a light-in-sensitive monomer which by itself forms water-insoluble polymers, but only in an effective amount such that a water developable layer results.

3. A reproduction layer according to claim 2 in which the copolymer includes, by polymerization, about 20 to 99 percent by weight of at least one vinyl monomer which by itself yields water-soluble polymers, about 1 to 40 percent by weight of at least one monomer of formulas I, II, III: and up to about 80 per cent by weight of the light-insensitive monomer which by itself forms water-insoluble polymers.

4. A reproduction layer according to claim 2 in which the copolymer is of N-vinyl-N-methyl acetamide, vinyl acetate, and 4-acrylamido benzopheone.

5. A reproduction layer according to claim 2 in which the copolymer is of dimethyl acrylamide, vinyl acetate, and

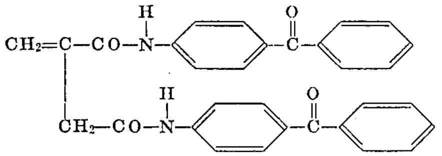

6. A reproduction layer according to claim 2 in which the copolymer is of dimethyl acrylamide, vinyl acetate and

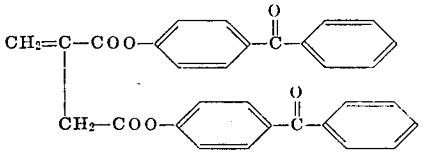

7. A reproduction layer according to claim 2 in which the copolymer is of N,N-dimethyl acrylamide, vinyl acetate and 4-acrylamido benzophenone.

8. A reproduction layer according to claim 1 in which the copolymer is of N,N-dimethyl acrylamide with 4-acrylamido benzophenone.

9. A reproduction layer according to claim 1 in which the copolymer is of N,N-dimethyl acrylamide with 4-acryloxybenzophenone.

10. A reproduction layer according to claim 1 in which the copolymer is of N,N-dimethyl acrylamide with 4-acrylamidoacetopenone.

11. A reproduction layer according to claim 1 in which the copolymer is of N-vinyl pyrrolidone and

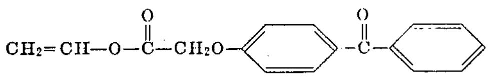

12. A reproduction layer according to claim 1 in which the copolymer is of dimethyl acrylamide, acrylamide and

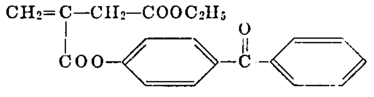

13. A reproduction layer according to claim 1 in which the copolymer is of N-tert.-butylacrylamide, N,N-dimethyl acrylamide, and 4-acrylamido benzophenone.

14. A reproduction layer according to claim 1 in which the copolymer is of N,N-dimethyl acrylamide and

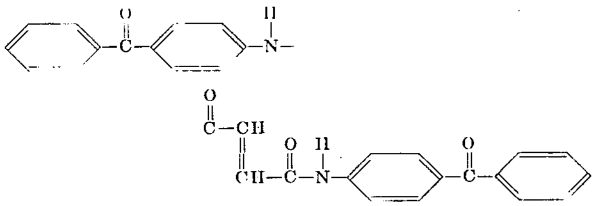

15. A reproduction layer according to claim 1 in which the copolymer is of N,N-dimethyl acrylamide and

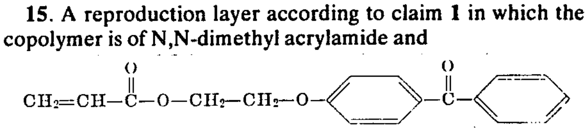

16. A reproduction layer according to claim 1 in which the copolymer is of N,N-dimethyl acrylamide and

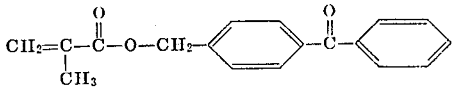

17. A reproduction layer according to claim 1 in which the copolymer is of N,N-dimethyl acrylamide and

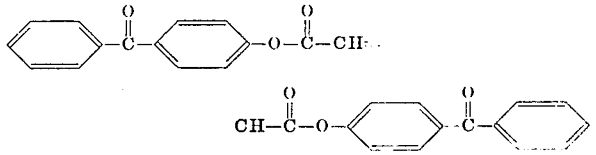

18. A process which comprises exposing a supporting light-sensitive reproduction layer to light under a master and developing the resulting image with a developer selected from the group consisting of water and an aqueous solution, the layer comprising a light-sensitive copolymer of an effective amount of at least one vinyl monomer which by itself yields water-soluble polymers, with an effective amount of at least one light-sensitive monomer of the following formulas I, II, and III:

I. $R_1-CH=C(R_2)-C(=O)-O-R_3$

II. $R_7-CH=C(R_8)-C(=O)-N(H)-R_9$

III.

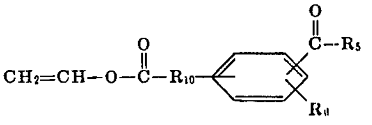

wherein $R_1$ is H, $-COOR_3$ or -COO-alkyl;

$R_2$ is H, alkyl, $-CH_2COO$-alkyl or $-CH_2COOR_3$ (only one of the substituents $R_1$ and $R_2$ containing, however the carbonyl group CO)

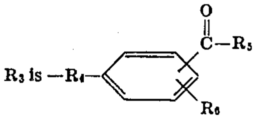

with $R_4$ being a single bond or $-CH_2$ or $-CH_2-CH_2-O$; $R_5$ is alkyl phenyl, alkaryl, alkoxyaryl or halogen aryl;

$R_6$ is H, alkyl alkoxy or halogen;

$R_7$ is H, $-CON(H)-R_9$, $-COO$-alkyl, $-COOR_3$ or $-COOH$;

$R_8$ is H alkyl, $-CH_2CONH$-alkyl, $-CH_2-CONH-R_9$, $-CH_2-COO$-alkyl, . $-CH-COOR_3$ or $-CH_2-COOH$ (wherein only one of the substituents $R_7$ and $R_8$ contains the carbonyl group CO, and

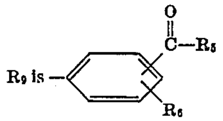

and wherein the case of the ketone monomers corresponding to formula II which are itaconic acid derivatives, the carboxylic acid functions NH alkyl, -O-alkyl, $OR_3$ and OH described for the substituent $R_8$ may replace the substituent, $-NH-R_9$, and vice versa, and $R_{10}$ is a single bond or $-CH_2O$

19. A process according to claim 18 in which the copolymer includes by polymerization, a light-insensitive monomer which by itself forms water-insoluble polymers, but only in an effective amount such that a water-developable layer results.

20. A process according to claim 19 in which the copolymer is of N-vinyl-N-methyl acetamide, vinyl acetate, and 4-acrylamido benzophenone.

21. A process according to claim 19 in which the copolymer is of dimethyl acrylamide, vinyl acetate, and

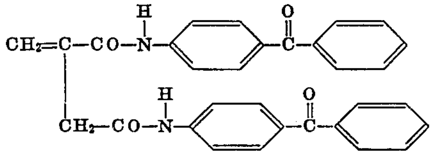

22. A process according to claim 19 in which the copolymer is of dimethyl acrylamide, vinyl acetate and

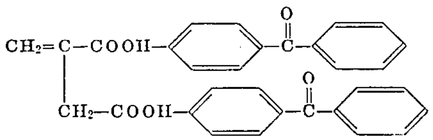

23. A process according to claim 19 in which the copolymer is of N,N-dimethyl acrylamide, vinyl acetate and 4-acrylamido benzophenone.

24. A process according to claim 18 in which the copolymer includes, by polymerization, about 20 to 99 per cent by weight of at least one vinyl monomer which by itself yields water-soluble polymers, about 1to 40 percent by weight of at least one monomer of formulas I, II, and III, and 0 to 80 percent by weight of the light-insensitive monomer which by itself forms water-insoluble polymers.

25. A process according to claim 18 in which the copolymer is of N,N-dimethyl acrylamide with 4-acrylamido benzophenone.

26. A process according to claim 18 in which the copolymer is of N,N-dimethyl acrylamide with 4-acryloxybenzophenone.

27. A process according to claim 18 in which the copolymer is of N,N-dimethyl acrylamide with 4-acrylamido acetophenone.

28. A process according to claim 18 in which the copolymer is of N-vinyl pyrrolidone and

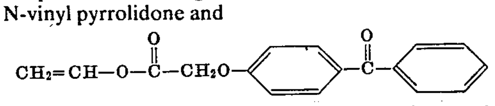

29. A process according to claim 18 in which the copolymer is of dimethyl acrylamide, acrylamide and

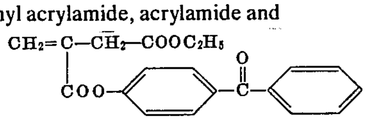

30. A process according to claim 18 in which the copolymer is of N-tert.-butylacrylamide, N,N-dimethyl acrylamide, and 4-acrylamido benzophenone.

31. A process according to claim 18 in which the copolymer is of N,N-dimethyl acrylamide and

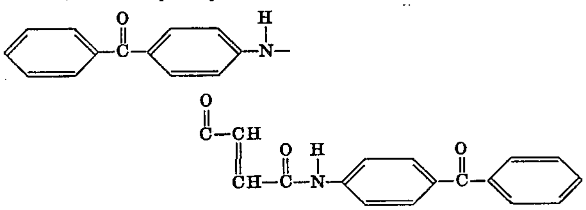

32. A process according to claim 18 in which the copolymer is of N,N-dimethyl acrylamide and

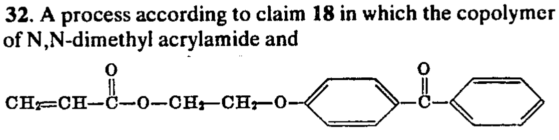

33. A process according to claim 18 in which the copolymer is of N,N-dimethyl acrylamide and

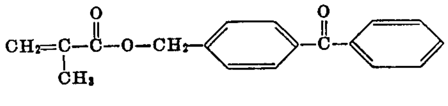

34. A process according to claim 18 in which the copolymer is of N,N-dimethyl acrylamide and

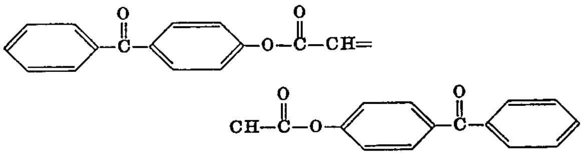

* * * * *

UNITED STATES PATENT OFFICE
CERTIFICATE OF CORRECTION

Patent No. 3,620,733 Dated November 16, 1971

Inventor(s) Hartmut Steppan, Günter Messwarb, and Walter Lüders

It is certified that error appears in the above-identified patent and that said Letters Patent are hereby corrected as shown below:

Column 1, line 52, "contains, consists" should read --- contains, or consists ---.

Column 2, line 31, "alkyl phenyl" should read --- alkyl, phenyl ---.

Column 2, line 59, "an" should read --- and ---.

Column 3, line 71, "system" should read --- systems ---.

Column 4, line 73, "leas tone" should read --- least one ---.

Column 5, line 49, "fluorescent tubes", second occurrence, should be deleted.

Column 5, line 64-65, "used After lacquer Removal hardened is not does" should be deleted.

Column 6, line 57, "b" should be deleted.

Column 8, line 29, "11" should read ---parts ---.

UNITED STATES PATENT OFFICE
CERTIFICATE OF CORRECTION

Patent No. 3,620,733 Dated November 16, 1971

Inventor(s) Hartmut Steppan, Günter Messwarb, and Walter Lüders

It is certified that error appears in the above-identified patent and that said Letters Patent are hereby corrected as shown below:

Column 10, line 52, "phenyl alkaryl" should read ---phenyl, alkaryl---.

Column 10, line 60, the extra subscript "$_3$" should be deleted.

Column 10, line 70, "9," should read ---case---.

Column 10, line 72, "function" should read ---functions---.

Column 11, line 2, "-NH-R 9" should read --- $-NH-R_9$ ---.

Column 11, line 19, "benzopheone" should read --- benzophenone ---.

Column 12, line 65, "alkyl" should read --- alkyl, ---.

Column 12, line 67, "alkyl alkoxy" should read --- alkyl, alkoxy ---.

Column 12, line 72, " H alkyl" should read --- H, alkyl ---.

Column 12, line 72, "$-R_9$ $-CH_2$" should read --- $-R_9$, $-CH_2$ ---.

Column 12, line 72, "$-CH-COOR_3$" should read --- $-CH_2-COOR_3$ ---.

Column 13, line 9, "NH alkyl" should read --- NH-alkyl ---.

Column 1, line 16, the hyphen should be deleted.

Column 1, line 30, "$CH_3$ aralkyl" should read --- $CH_3$, aralkyl ---.

UNITED STATES PATENT OFFICE
CERTIFICATE OF CORRECTION

Patent No. 3,620,733 Dated November 16, 1971

Inventor(s) Hartmut Steppan et al. PAGE - 3

It is certified that error appears in the above-identified patent and that said Letters Patent are hereby corrected as shown below:

The structural formula of Claim 22 should read as follows:

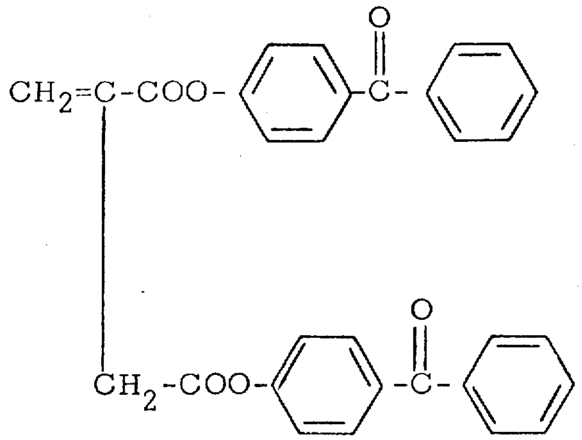

Signed and sealed this 4th day of July 1972.

(SEAL)
Attest:

EDWARD M.FLETCHER,JR.
Attesting Officer

ROBERT GOTTSCHALK
Commissioner of Patents